(12) United States Patent
Kawashima et al.

(10) Patent No.: US 12,206,008 B2
(45) Date of Patent: Jan. 21, 2025

(54) SEMICONDUCTOR DEVICE

(71) Applicant: RENESAS ELECTRONICS CORPORATION, Tokyo (JP)

(72) Inventors: Yoshiyuki Kawashima, Tokyo (JP); Masao Inoue, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 320 days.

(21) Appl. No.: 17/513,404

(22) Filed: Oct. 28, 2021

(65) Prior Publication Data

US 2022/0157964 A1    May 19, 2022

(30) Foreign Application Priority Data

Nov. 18, 2020  (JP) ................. 2020-191344

(51) Int. Cl.
*H01L 29/51* (2006.01)
*H01L 29/423* (2006.01)
*H01L 29/792* (2006.01)

(52) U.S. Cl.
CPC ...... *H01L 29/513* (2013.01); *H01L 29/42344* (2013.01); *H01L 29/517* (2013.01); *H01L 29/792* (2013.01)

(58) Field of Classification Search
CPC ............. H01L 29/513; H01L 29/42344; H01L 29/517; H01L 29/792
See application file for complete search history.

(56) References Cited

U.S. PATENT DOCUMENTS

| | | | |
|---|---|---|---|
| 7,456,468 B2 | 11/2008 | Jeon et al. | |
| 8,258,571 B2 | 9/2012 | Endoh et al. | |
| 8,674,430 B2 | 3/2014 | Yasuda et al. | |
| 2005/0110101 A1* | 5/2005 | Kaneko | H01L 21/28194 257/E21.422 |
| 2008/0237688 A1* | 10/2008 | Yasuda | H01L 29/40117 257/E21.21 |
| 2015/0060991 A1* | 3/2015 | Mizutani | H01L 29/513 438/287 |

(Continued)

FOREIGN PATENT DOCUMENTS

| | | | | |
|---|---|---|---|---|
| CN | 109087947 A | * 12/2018 | ............ | H01L 21/84 |
| JP | 2006-203200 A | 8/2006 | | |
| JP | 2009-027134 A | 2/2009 | | |

(Continued)

OTHER PUBLICATIONS

Notice of Reasons for Refusal issued in Japanese Patent Application No. 2020-191344, dated Jan. 23, 2024.

*Primary Examiner* — Mohammad M Choudhry

(74) *Attorney, Agent, or Firm* — Rimon P.C.

(57) ABSTRACT

A memory cell which is a non-volatile memory cell includes a gate insulating film having a charge storage layer capable of retaining charge and a memory gate electrode formed on the gate insulating film. The charge storage layer includes a first insulating film containing hafnium and silicon and a second insulating film formed on the first insulating film and containing hafnium and silicon. Here, a hafnium concentration of the first insulating film is lower than a hafnium concentration of the second insulating film, and a bandgap of the first insulating film is larger than a bandgap of the second insulating film.

8 Claims, 8 Drawing Sheets

(56) References Cited

U.S. PATENT DOCUMENTS

2019/0348428 A1* 11/2019 Tsuda .................... H10B 43/30
2020/0027996 A1  1/2020 Inoue et al.

FOREIGN PATENT DOCUMENTS

| JP | 2013-058592 A | | 3/2013 | | |
|---|---|---|---|---|---|
| JP | 2020-013850 A | | 1/2020 | | |
| WO | WO-2006112793 A1 | * | 10/2006 | ............. | B82Y 10/00 |

* cited by examiner

| OPERATION \ APPLIED VOLTAGE | Vd | Vmg | Vs | Vb |
|---|---|---|---|---|
| WRITE | -6V | Vcc | -6V | -6V |
| ERASE | Vcc | -6V | Vcc | Vcc |
| READ | Vcc | Vcc | 0V | 0V |

Vcc = 1.5V

SEMICONDUCTOR DEVICE

CROSS-REFERENCE TO RELATED APPLICATIONS

The disclosure of Japanese Patent Application No. 2020-191344 filed on Nov. 18, 2020 including the specification, drawings and abstract is incorporated herein by reference in its entirety.

BACKGROUND

The present invention relates to a semiconductor device, and particularly relates to a technology effectively applied to a semiconductor device having a non-volatile memory cell.

Flash memory and EEPROM (Electrically Erasable and Programmable Read Only Memory) have been widely used as electrically programmable and erasable non-volatile memories. Examples of these non-volatile memory cells include a memory cell referred to as a MONOS (Metal oxide Nitride Oxide Semiconductor) transistor in which a charge storage layer having a trap insulating film such as a silicon nitride film is provided under a gate electrode. By injecting and emitting charge into and from this charge storage layer to shift the threshold value of the transistor, this transistor can be used as a non-volatile memory cell. Also, in recent years, a non-volatile memory cell using a high dielectric constant film such as a hafnium oxide film instead of the silicon nitride film as the charge storage layer has been developed.

For example, Patent Document 1 (Japanese Unexamined Patent Application Publication No. 2020-13850) discloses a non-volatile memory cell using metal oxide films for a charge storage layer and a top insulating film on the charge storage layer.

There are Disclosed Techniques Listed Below

[Patent Document 1] Japanese Unexamined Patent Application Publication No. 2020-13850

SUMMARY

It has been desired to improve the reliability such as retention characteristics in a non-volatile memory cell using a high dielectric constant film.

The other object and the novel feature will be apparent from the description of this specification and accompanying drawings.

An outline of the typical embodiment disclosed in this application will be briefly described as follows.

A semiconductor device according to one embodiment is a semiconductor device having a non-volatile memory cell which includes: a semiconductor substrate; a first insulating film formed on the semiconductor substrate; a charge storage layer formed on the first insulating film and capable of retaining charge; a second insulating film formed on the charge storage layer; and a first gate electrode formed on the second insulating film. Here, the charge storage layer includes: a third insulating film formed on the first insulating film and containing hafnium and silicon; and a fourth insulating film formed on the third insulating film and containing hafnium and silicon. Also, a hafnium concentration of the third insulating film is lower than a hafnium concentration of the fourth insulating film, and a bandgap of the third insulating film is larger than a bandgap of the fourth insulating film.

According to an embodiment, it is possible to improve the reliability of the semiconductor device.

DETAILED DESCRIPTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification, details, or a supplementary explanation thereof. Also, in the embodiments described below, when mentioning the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference signs throughout the drawings for describing the embodiments, and the repetitive description thereof will be omitted. In addition, the description of the same or similar portions is not repeated in principle unless particularly required in the following embodiments.

Also, in some drawings used in the following embodiments, hatching is omitted in some cases so as to make the drawings easy to see.

First Embodiment

<Structure of Memory Cell MC1>

Figure 1:
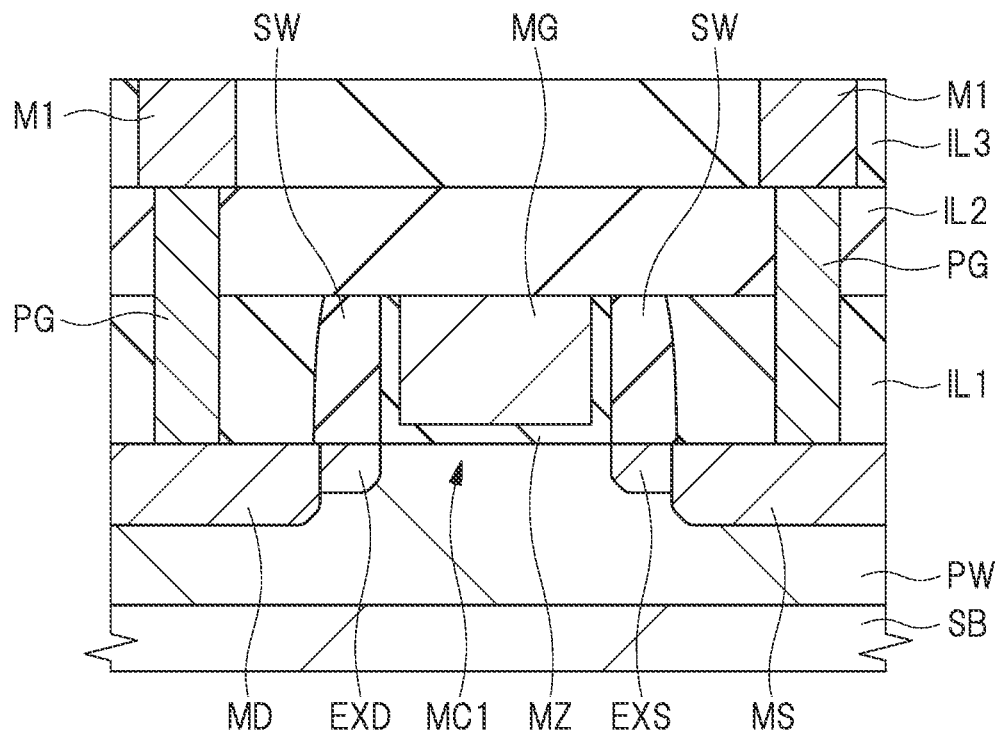
FIG. 1 is a cross-sectional view showing a semiconductor device according to the first embodiment.
Figures 3, 4:
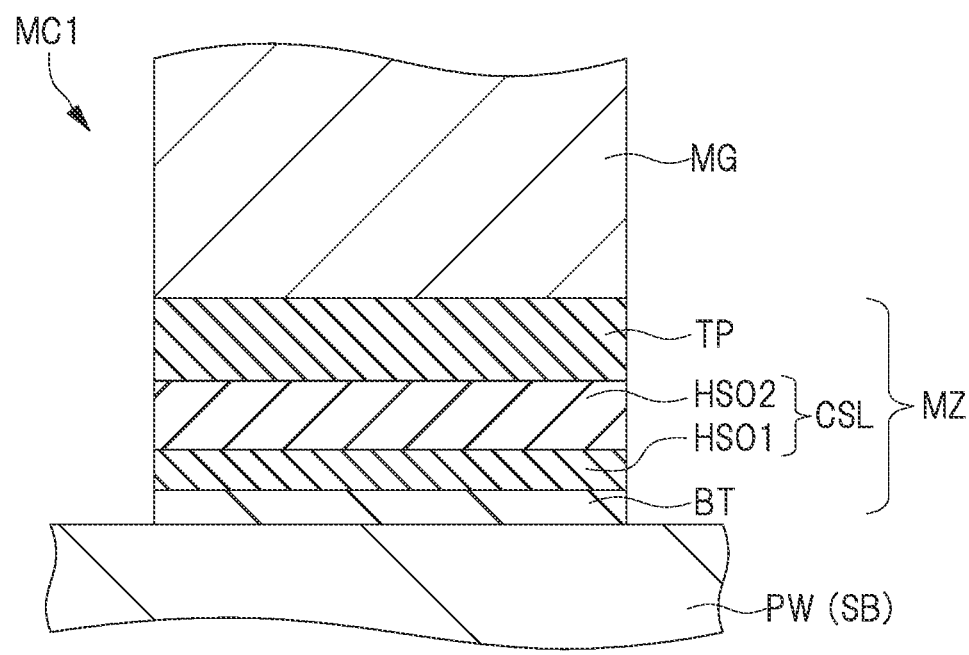
FIG. 3 is a table showing an example of voltage application conditions to each portion of a selection memory cell at the time of "write", "erase", and "read".
FIG. 4 is a cross-sectional view showing a principal part of the semiconductor device according to the first embodiment in an enlarged manner.

A semiconductor device including a memory cell MC1 which is a non-volatile memory cell according to the present embodiment will be described with reference to drawings. FIG. 1 is a cross-sectional view showing a semiconductor device according to the present embodiment, and FIG. 4 is a cross-sectional view showing a principal part of FIG. 1 in an enlarged manner.

The memory cell MC1 according to the present embodiment is an n-type transistor having a charge storage layer CSL capable of retaining a charge in a gate insulating film MZ, and the charge storage layer CSL has a trap insulating film.

As shown in FIG. 1, a p-type well region PW is formed in a semiconductor substrate (substrate) SB, and the memory cell MC1 is formed in the well region PW. The semiconductor substrate SB is made of, for example, p-type single crystal silicon (Si) having a specific resistance of 1 Ωcm to 10 Ωcm.

The gate insulating film MZ is formed on the semiconductor substrate SB, that is, on the well region PW1, and a memory gate electrode MG is formed on the gate insulating film MZ. The gate insulating film MZ continuously covers the bottom surface and the side surfaces of the memory gate electrode MG.

The memory gate electrode MG is, for example, a conductive film such as a polycrystalline silicon film in which an n-type impurity is introduced. In addition, in order to secure the hole tunneling current at the time of erase, a polycrystalline silicon film in which a p-type impurity is introduced or a polycrystalline silicon film in which no impurity is introduced may be applied to the memory gate electrode MG. Further, the memory gate electrode MG may be a metal film such as a titanium nitride film, an aluminum film or a tungsten film, or a stacked film of these metal films.

Also, in FIG. 1, the gate insulating film MZ is represented as a single-layer insulating film in order to make the drawing easier to see. However, as will be described later in FIG. 4, the gate insulating film MZ is actually a stacked film including an insulating film BT, an insulating film HSO1, an insulating film HSO2, and an insulating film TP formed in this order on the semiconductor substrate SB.

Sidewall spacers SW are formed on side surfaces of the memory gate electrode MG via the gate insulating film MZ. The sidewall spacer SW is composed of, for example, a stacked film of a silicon oxide film and a silicon nitride film.

An extension region EXS and an extension region EXD, which are low-concentration n-type impurity regions, are formed in the well region PW under the sidewall spacers SW. Also, a diffusion region MS which is an n-type impurity region having a higher concentration than the extension region EXS and a diffusion region MD which is an n-type impurity region having a higher concentration than the extension region EXD are formed in the well region PW at positions aligned with the sidewall spacers SW. The extension region EXS and the diffusion region MS are connected to each other and each form a part of a source region of the memory cell MC1. The extension region EXD and the diffusion region MD are connected to each other and each form a part of a drain region of the memory cell MC1.

Though not shown, a silicide layer made of, for example, cobalt silicide ($CoSi_2$), nickel silicide (NiSi), or nickel platinum silicide (NiPtSi) may be formed on the memory gate electrode MG, the diffusion region MS, and the diffusion region MD. The silicide layer is formed in order to mainly reduce the contact resistance with a plug PG described later.

On the memory cell MC1 described above, a stacked film composed of interlayer insulating films IL1 and IL2 sequentially stacked on the semiconductor substrate SB is formed. The upper surfaces of the interlayer insulating film IL1, the sidewall spacers SW, the gate insulating film MZ, and the memory gate electrode MG are planarized on substantially the same plane. An interlayer insulating film IL2 is formed on the upper surfaces thereof. A plurality of contact holes is formed in the stacked film, and a plurality of plugs PG is formed in the plurality of contact holes. The plug PG is composed of, for example, a barrier metal film made of a titanium film, a titanium nitride film, or a stacked film thereof and a conductive film mainly made of tungsten. The plug PG is electrically connected to the diffusion region MS or the diffusion region MD. Though not shown, the plug PG electrically connected to the memory gate electrode MG is also present in the interlayer insulating film IL2.

An interlayer insulating film IL3 is formed on the plugs PG and the interlayer insulating film IL2. Wiring trenches are formed in the interlayer insulating film IL3, and wirings M1 having a conductive film mainly made of, for example, copper are buried in the trenches. Also, the wiring M1 is electrically connected to the plug PG. The wiring described above is the wiring having a so-called Damascene structure. Multi-layer wirings and interlayer insulating films are further formed above the wiring M1, but the illustrations and descriptions thereof are omitted here. The interlayer insulating films IL1 to IL3 are mainly composed of, for example, a silicon oxide film.

<Operation of Memory Cell MC1>

An operation example of the memory cell MC1 which is a non-volatile memory cell will be described with reference to FIG. 2 and FIG. 3. Note that the memory cell MC1 described here is a selection memory cell among the plurality of memory cells MC1 present in the semiconductor device.

Figure 2:
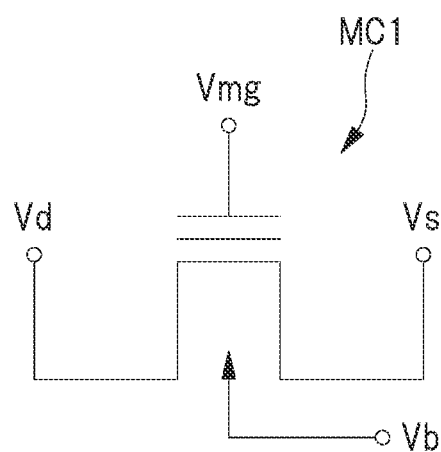
FIG. 2 is an equivalent circuit diagram of a memory cell according to the first embodiment.

FIG. 2 is an equivalent circuit diagram of the memory cell MC1. FIG. 3 is a table showing an example of voltage application conditions to each portion of the memory cell MC1 at the time of "write", "erase", and "read". The table of FIG. 3 shows a voltage Vd applied to the diffusion region MD which is the drain region, a voltage Vmg applied to the memory gate electrode MG, a voltage Vs applied to the diffusion region MS which is the source region, and a voltage Vb applied to the well region PW at the time of "write", "erase", and "read", respectively.

Note that those shown in the table of FIG. 3 are preferable examples of the voltage application conditions, and the present invention is not limited to these, and various changes can be made as necessary. Also, in the present embodiment, the injection of electrons from the well region PW to the charge storage layer CSL is defined as "write". Further, the emission of electrons from the charge storage layer CSL to the well region PW or the injection of holes from the well region PW to the charge storage layer CSL is defined as "erase".

The write operation is performed by the FN tunneling (Fowler Nordheim Tunneling) method. For example, the write is performed by applying the voltages shown in the sections of the row of "write" in FIG. 3 to each portion of the memory cell MC1 where the write is performed, and injecting electrons from the well region PW to the charge storage layer CSL of the memory cell MC1. The injected electrons are trapped in the trap level in the charge storage layer CSL, resulting in an increase in the threshold voltage of the memory transistor having the memory gate electrode MG. Namely, the memory transistor is brought into the write state.

The erase operation is performed by the FN tunneling method. For example, by applying the voltages shown in the sections of the row of "erase" in FIG. 3 to each portion of the memory cell MC1 where the erase is performed, the electrons in the charge storage layer CSL are emitted to the well region PW or the holes in the well region PW are injected into the charge storage layer CSL. As a result, the threshold voltage of the memory transistor decreases. Namely, the memory transistor is brought into the erase state.

The read operation is performed by applying the voltages shown in the sections of the row of "read" in FIG. 3 to each portion of the memory cell MC1 where the read is performed. The write state or the erase state can be discriminated by setting the voltage Vmg applied to the memory gate electrode MG at the time of read to a value between the threshold voltage of the memory transistor in the write state and the threshold voltage of the memory transistor in the erase state.

<Detailed Structure of Gate Insulating Film MZ>

FIG. 4 is a cross-sectional view showing a principal part of the semiconductor device shown in FIG. 1 in an enlarged manner, and is a cross-sectional view showing a detailed structure of the gate insulating film MZ.

The gate insulating film MZ is a film that is interposed between the semiconductor substrate SB (well region PW) and the memory gate electrode MG and functions as the gate insulating film of the memory cell MC1, and is a stacked film having the charge storage layer CSL formed therein. Specifically, the gate insulating film MZ is composed of a stacked film including the insulating film BT formed on the semiconductor substrate SB, the insulating film HSO1 formed on the insulating film BT, the insulating film HSO2 formed on the insulating film HSO1, and the insulating film TP formed on the insulating film HSO2.

The insulating film (bottom insulating film) BT is, for example, a silicon oxide film or a silicon oxynitride film and has a thickness of, for example, 2 nm to 5 nm. Here, the film thickness of the insulating film ET is, for example, 2 nm. A relative dielectric constant of the insulating film BT is, for example, 4.

The insulating film HSO1 is a film having a dielectric constant higher than that of a silicon nitride film, is a metal oxide film, and has a thickness of, for example, 1.5 nm to 3 nm. Here, the film thickness of the insulating film HSO1 is, for example, 2 nm. Specifically, the insulating film HSO1 is a film containing hafnium (Hf), silicon (Si), and oxygen (O), and is preferably a hafnium silicate film such as an $Hf_xSi_{1-x}O_2$ ($0<x<1$) film. The insulating film HSO1 has an Si concentration higher than that of the insulating film HSO2, and an Hf concentration of the insulating film HSO1 is 60% or less, preferably 20 to 50%. Here, the Hf concentration of the insulating film HSO1 is, for example, 50%. A density of the trap level in the insulating film HSO1 is lower than a density of the trap level in the insulating film HSO2. A relative dielectric constant of the insulating film HSO1 is, for example, 10.

Here, the total film thickness of the insulating film BT and the insulating film HSO1 needs to be 3 nm or more. This is because, when the film thickness is less than 3 nm, the charge is likely to escape from the charge storage layer CSL due to direct tunneling during data retention and the retention characteristics (charge retention characteristics, data retention characteristics) of the memory cell MC1 are deteriorated. In the present embodiment, the total film thickness of the insulating film BT and the insulating film HSO1 is 4 nm. It is preferable that the insulating film BT and the insulating film HSO1 have substantially the same thickness.

The insulating film HSO2 is a film having a dielectric constant higher than those of a silicon nitride film and the insulating film HSO1, is a metal oxide film, and has a thickness of, for example, 10 nm to 20 nm. Specifically, the insulating film HSO2 is a film containing hafnium (Hf), silicon (Si), and oxygen (O), and is preferably a hafnium silicate film such as an $Hf_xSi_{1-x}O_2$ ($0<x<1$) film. The insulating film HSO2 has an Hf concentration higher than that of the insulating film HSO2, and the Hf concentration of the insulating film HSO1 is preferably 60 to 90%. The purpose of setting the concentration in this way is to make the density of the trap level in the insulating film HSO2 higher than the density of the trap level in the insulating film HSO1, thereby trapping the charge in the insulating HSO2. For example, the Hf concentration in the insulating film HSO2 is about four times the Si concentration in the insulating film HSO2. Here, the Hf concentration of the insulating film HSO2 is, for example, 80%. A relative dielectric constant of the insulating film HSO2 is, for example, 20.

The insulating film (top insulating film) TP is a film having a dielectric constant higher than that of a silicon nitride film, is a metal oxide film made of a material different from those of the insulating film HSO1 and the insulating film HSO2, and has a thickness of, for example, 5 nm to 12 nm. Specifically, the insulating film TP is a film containing aluminum (Al) and oxygen (O), and is preferably an aluminum oxide film, an aluminum oxynitride film, or an aluminum silicate film. Here, the insulating film TP is an aluminum oxide film such as an $Al_2O_3$ film. A relative dielectric constant of the insulating film TP is, for example, 10. Also, a different metal oxide film can be used as the insulating film TP. For example, a metal oxide film made of an oxide of any of metals such as titanium (Ti), zirconium (Zr), yttrium (Y), lanthanum (La), praseodymium (Pr), or lutetium (Lu) can also be used as the insulating film TP.

The insulating film TP mainly functions to prevent the charge accumulated in the charge storage layer CSL from escaping to the memory gate electrode MG.

Here, the case where the insulating film TP is composed of one metal oxide film has been described. However, the insulating film TP may have a stacked structure composed of, for example, an aluminum oxide film, a hafnium silicate film, and an aluminum oxide film stacked in order from the side of the semiconductor substrate SB.

By the way, in a conventional non-volatile memory cell, an ONO (oxide nitride oxide) film in which a silicon oxide film, a silicon nitride film which is a charge storage layer, and a silicon oxide film are stacked has been known as a gate insulating film having a trap level. Since the dielectric constant is relatively low when the ONO film is used, the EOT (Equivalent Oxide Thickness) of the gate insulating film becomes large. Therefore, there is a concern that the operating voltage becomes high due to the large EOT of the gate insulating film. Further, if trying to reduce the physical film thickness in order to reduce the EOT of the gate insulating film, there is a concern that the retention characteristics are deteriorated due to the leakage of the charge accumulated in the charge storage layer. These deteriorate the reliability of the semiconductor device.

In the present embodiment, the charge storage layer CSL is mainly composed of the insulating films HSO1 and HSO2 which are high dielectric constant films. Further, the insulating film TP is also a high dielectric constant film. Since these films can increase the physical film thickness of the gate insulating film MZ while suppressing the EOT of the gate insulating film MZ, it is possible to prevent the deterioration of the retention characteristics due to the leakage and improve the retention characteristics. In addition, since the EOT can be reduced while ensuring the physical film thickness of the gate insulating film MZ, it is possible to reduce the operating voltage of the memory cell MC1 and improve the operating speed while preventing the deterioration of the retention characteristics due to the leakage.

<Effect of Semiconductor Device According to Embodiment>

In a non-volatile semiconductor device, it is important to lower the operating voltage of the high voltage circuit for operating the memory cell from the viewpoint of reducing the area of the memory peripheral circuit. Namely, in order to miniaturize the semiconductor device, it is important to realize the low voltage operation of the memory cell.

Here, a memory cell in which a charge storage layer made of one HfSiO film formed on a semiconductor substrate via a bottom insulating film is provided and a top insulating film and a memory gate electrode are sequentially stacked on the charge storage layer will be considered as a comparative example. The film thickness of the bottom insulating film is, for example, 3 nm.

In order to operate such a memory cell at a lower voltage, it is conceivable to reduce the thickness of the charge storage layer or the bottom insulating film under the charge storage layer. Further, the erasing speed can be increased if the bottom insulating film is made thin. However, there is a problem that the retention characteristics of the memory cell are deteriorated if the charge storage layer or the bottom insulating film is made thin. If the bottom oxide film is made thicker in order to prevent the deterioration of the retention characteristics, the voltage applied to the memory gate electrode must be increased, so that the area of the memory peripheral circuit increases. Namely, in the memory cell of the comparative example, the operating voltage and the retention characteristics of the memory cell are in a trade-off relationship.

Thus, in the present embodiment, the charge storage layer CSL is configured to have the stacked structure composed of the two films of the insulating films HSO1 and HSO2 stacked in order from the side of the semiconductor substrate SB as shown in FIG. 4. As a main feature of the present embodiment, the insulating film HSO2 on the side of the memory gate electrode MG has a bandgap smaller than that of the insulating film HSO1 on the side of the semiconductor substrate SB. In order to realize this bandgap relationship, the Hf concentration of the insulating film HSO1 is set to be lower than the Hf concentration of the insulating film HSO2.

Figure 5:
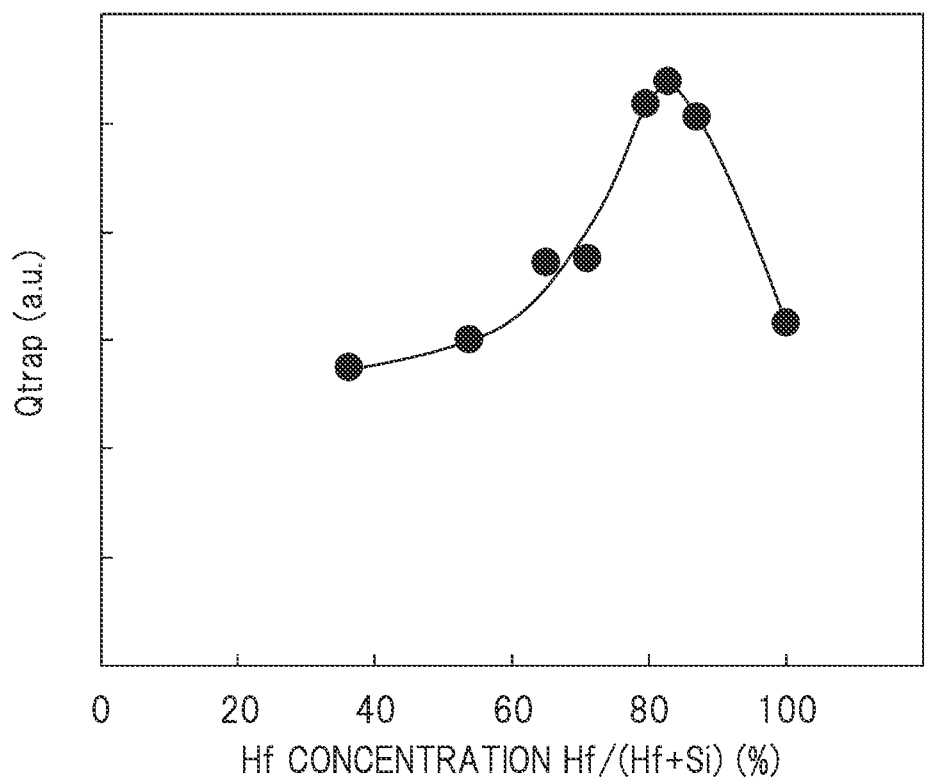
FIG. 5 is a graph showing a relationship between an Hf concentration and a charge storage amount of a charge storage layer.

FIG. 5 shows the Hf concentration dependence of the trap in the film of the charge storage layer by a graph. FIG. 5 is a graph showing a relationship between an Hf concentration and a charge storage amount of a charge storage layer. The horizontal axis of the graph represents the Hf concentration of the charge storage layer and the vertical axis represents the charge storage amount (charge trapping amount) of the charge storage layer.

As shown in FIG. 5, when the Hf concentration of the charge storage layer is about 83% or less, the charge storage amount increases as the Hf concentration becomes higher. When the Hf concentration of the charge storage layer exceeds about 83%, the charge storage amount decreases as the Hf concentration becomes higher. However, even if the Hf concentration is 100%, the charge storage amount is larger than that in the case where the Hf concentration is 60% or less. Therefore, when the Hf concentration of the insulating film HSO1 is made lower than 60% and the Hf concentration of the insulating film HSO2 is made higher than the Hf concentration of the insulating film HSO1, the charge storage amount of the insulating film HSO1 becomes smaller than the charge storage amount of the insulating film HSO2.

Accordingly, in the present embodiment, the Hf concentration of the insulating film HSO1 is set to be less than 60%, and it is particularly desirable that the concentration is 20% or more and 50% or less. On the other hand, it is desirable that the Hf concentration of the insulating film HSO2 is 60% or more and 90% or less.

Figure 6:
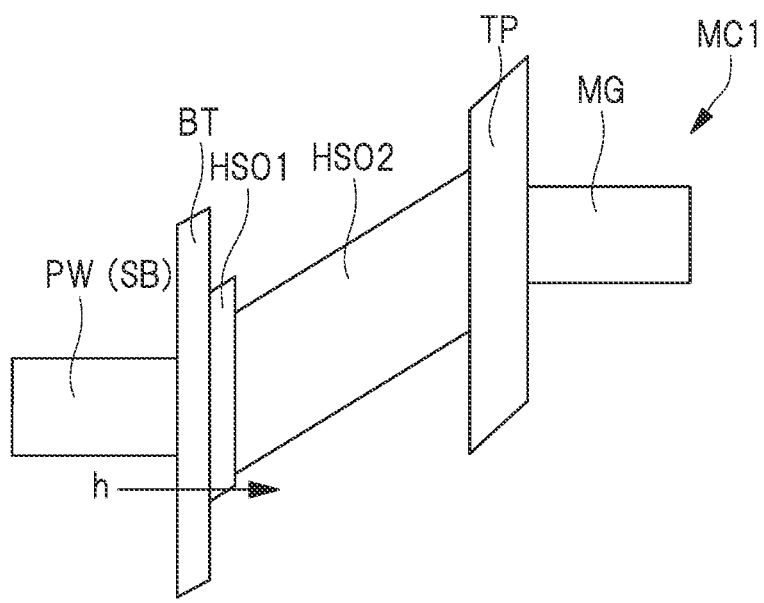
FIG. 6 is a band diagram for describing a potential at the time of an erase operation of the memory cell according to the first embodiment.
Figure 7:
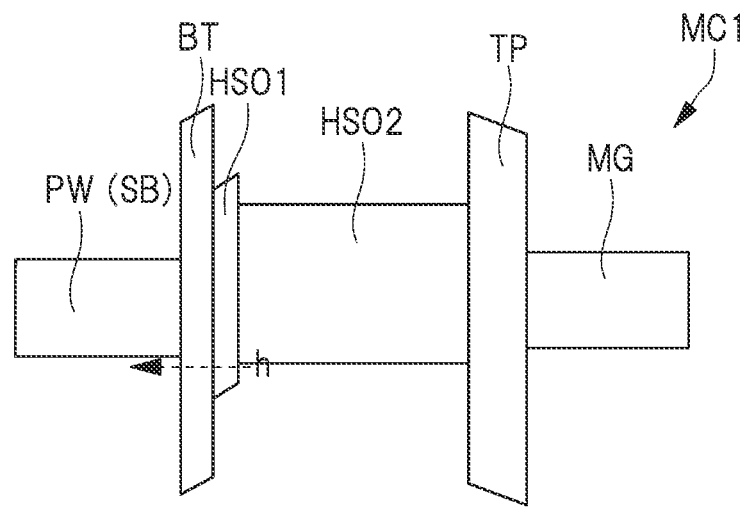
FIG. 7 is a band diagram for describing a potential at the time of data retention of the memory cell according to the first embodiment.

Next, the potential at the time of erase operation and data retention will be described with reference to FIG. 6 and FIG. 7. FIG. 6 is a band diagram for describing the potential at the time of the erase operation of the memory cell according to the present embodiment. FIG. 7 is a band diagram for describing the potential at the time of data retention of the memory cell according to the present embodiment.

In FIG. 6 and FIG. 7, the band structures of the semiconductor substrate SB, the insulating films BT, HSO1, HSO2, and TP, and the memory gate electrode MG are shown in order from the left side. As shown in FIG. 6 and FIG. 7, the bandgap of the insulating film HSO1 is larger than the bandgap of the insulating film HSO2.

Here, at the time of erase operation of the memory cell, the memory cell has such a potential as shown in FIG. 6. When a high electric field is applied as in the write operation or the erase operation, the slope of the potential becomes large. Therefore, since the barrier of the insulating film HSO1 which is a lower layer portion in the charge storage layer is almost eliminated, the charge (holes in this case) that has passed through the barrier of the insulating film BT can be injected into the insulating film HSO2 which is the charge storage layer in an upper layer portion. Namely, the charge passes through the inclined portion of the potential of the insulating film HSO1, and in this case, the charge passes through the insulating film HSO1 by the FN tunneling method. Therefore, the speed of the erase operation is faster in the present embodiment as compared with the memory cell of the above comparative example which does not have the insulating film HSO1.

On the other hand, as shown in FIG. 7, the data retention state, the slope of the potential is small. Therefore, even if the charge (holes in this case) trapped in the insulating film HSO2 tries to pass to the side of the semiconductor substrate SB, the insulating film BT and the insulating film HSO1 which is the lower layer portion in the charge storage layer serve as a barrier. Namely, the charge must pass between both ends corresponding to the maximum width of the insulating film HSO1, and the direct tunneling method is used to pass through the insulating film HSO1. Therefore, as compared with the memory cell of the above comparative example which does not have the insulating film HSO1, the probability of charge release from the insulating film HSO2 is lowered and the retention characteristics are improved in the present embodiment.

Namely, in the present embodiment, by providing the insulating film HSO1 having a lower Hf concentration and a larger bandgap than the insulating film HSO2 as the lower layer portion of the charge storage layer CSL, the deterioration of the retention characteristics can be prevented even if the insulating film BT is thinned. Therefore, the erasing speed can be improved by thinning the insulating film BT, and the low-voltage operation of the memory cell can be realized. Accordingly, the area of the memory peripheral circuit can be reduced. As a result, the reliability of the semiconductor device can be improved.

In the present embodiment, the case in which the charge storage layer CSL is configured to have a stacked structure composed of two layers and the Hf concentrations of the two layers are made different has been described. A transition layer having an intermediate Hf concentration between those of the two layers may be provided between these two layers. In this case, the charge storage layer CSL is composed of a plurality of insulating films stacked in order from the side of the semiconductor substrate SB, and the Hf concentrations of these insulating films become higher in order from the side of the semiconductor substrate SB.

Also, the difference in Hf concentration between the lower layer portion and the upper layer portion of the charge storage layer CSL may change continuously. In this case, the charge storage layer CSL is composed of, for example, one layer, and the Hf concentration of the charge storage layer CSL increases continuously from the lower surface side to the upper surface side of the charge storage layer CSL.

<Method of Manufacturing Memory Cell MC1>

Hereinafter, the method of manufacturing the semiconductor device according to the present embodiment will be described with reference to FIG. 8 to FIG. 13.

Figure 8:
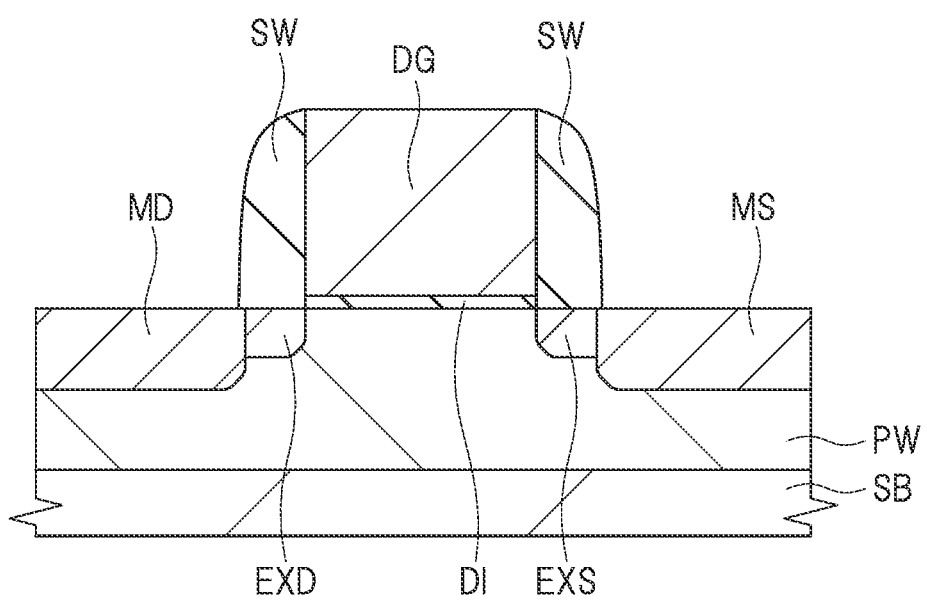
FIG. 8 is a cross-sectional view for describing a manufacturing process of the semiconductor device according to the first embodiment.

First, as shown in FIG. 8, the p-type well region PW is formed by introducing, for example, boron (B) or boron difluoride (BF$_2$) into the semiconductor substrate SB by the photolithography method and the ion implantation method. Subsequently, after a dummy insulating film DI is formed on the semiconductor substrate SB by, for example, the oxidation method, a polysilicon film and a cap insulating film CAP are formed on the dummy insulating film DI. Subsequently, by patterning the cap insulating film CAP, the polysilicon film, and the dummy insulating film DI, a dummy gate electrode DG made of the polysilicon film is formed.

Next, by introducing, for example, arsenic (As) or phosphorus (P) into the well region PW next to the dummy gate electrode DG by the ion implantation method, the extension region EXS and the extension region EXD, which are n-type impurity regions, are formed.

Next, an insulating film made of, for example, a silicon nitride film is formed by, for example, the LPCVD method so as to cover the stacked film composed of the dummy insulating film DI, the dummy gate electrode DG, and the cap insulating film CAP. Next, by performing anisotropic etching to the insulating film, the sidewall spacers SW are formed on the side surfaces of the stacked film. The insulating film constituting the sidewall spacer SW may be a silicon oxide film and a silicon nitride film formed on the silicon oxide film.

Next, by introducing, for example, arsenic (As) or phosphorus (P) into the well region PW by the ion implantation method using the sidewall spacers SW as a mask, the diffusion region MS and the diffusion region MD, which are n-type impurity regions, are formed. The diffusion region MS has an impurity concentration higher than that of the extension region EXS, is connected to the extension region EXS, and forms a part of the source region of the memory cell MC1. The diffusion region MD has an impurity concentration higher than that of the extension region EXD, is connected to the extension region EXD, and forms a part of the drain region of the memory cell MC1. In this way, the structure shown in FIG. 8 is obtained.

Figure 9:
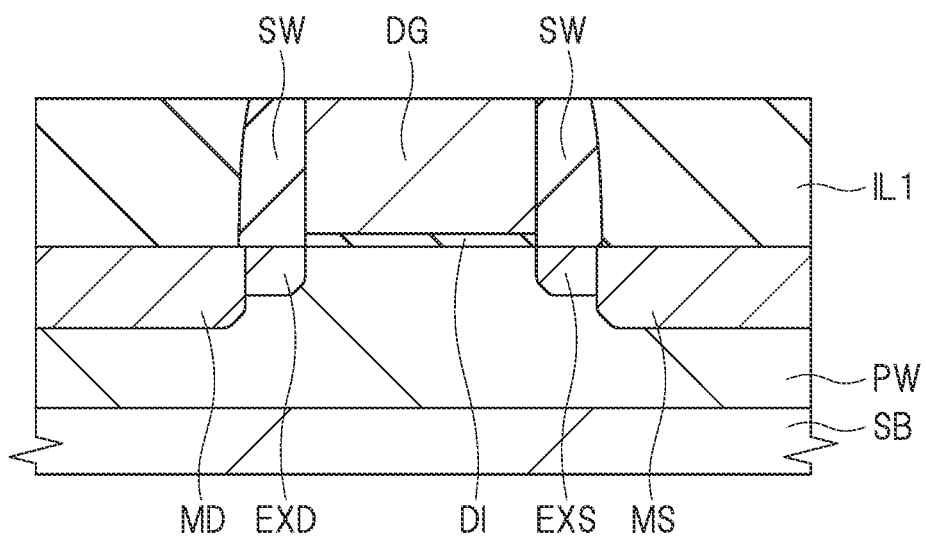
FIG. 9 is a cross-sectional view for describing the manufacturing process subsequent to FIG. 8.

Next, as shown in FIG. 9, the interlayer insulating film IL1 is formed so as to cover the stacked film. For example, a single film of a silicon oxide film or a stacked film composed of a silicon nitride film and a thick silicon oxide film on the silicon nitride film is used as the interlayer insulating film IL1. After forming the interlayer insulating film IL1, the upper surface of the interlayer insulating film IL1 is polished by the CMP (Chemical Mechanical Polishing) method, thereby removing the cap insulating film CAP and exposing the upper surfaces of the sidewall spacers SW and the dummy gate electrode DG.

Figure 10:
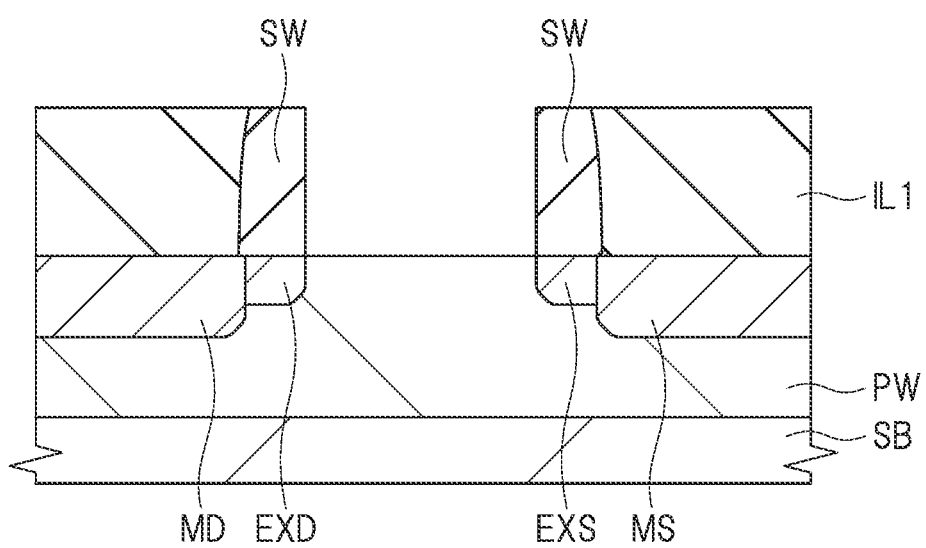
FIG. 10 is a cross-sectional view for describing the manufacturing process subsequent to FIG. 9.

Next, as shown in FIG. 10, the dummy gate electrode DG and the dummy insulating film DI are removed by, for example, the wet etching method. In this way, a trench is formed in the region from which the dummy gate electrode DG and the dummy insulating film DI have been removed.

Figure 11:
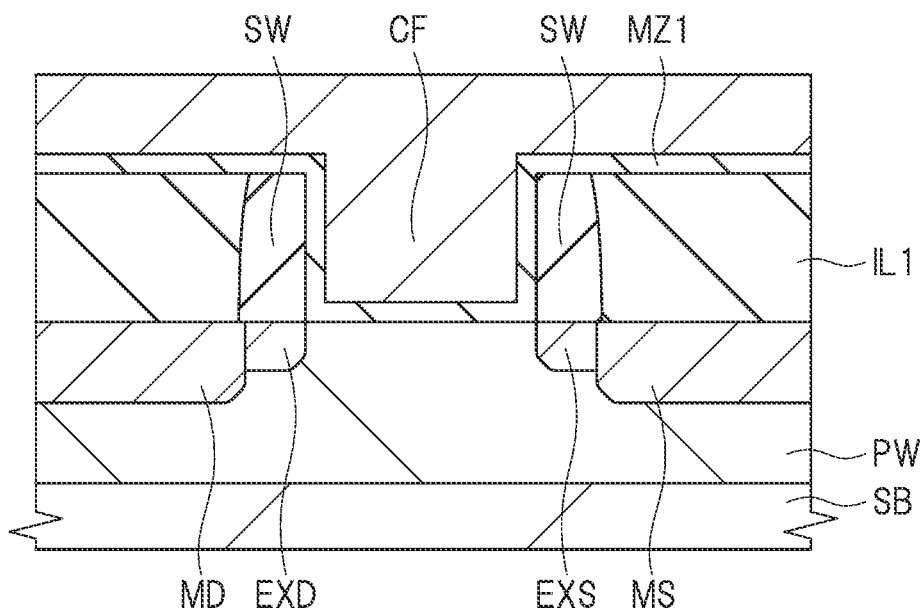
FIG. 11 is a cross-sectional view for describing the manufacturing process subsequent to FIG. 10.

Next, as shown in FIG. 11, an insulating film MZ1 and a conductive film CF are sequentially formed on the semiconductor substrate SB including the inside of the trench, thereby completely filling the trench. The insulating film MZ1 is a stacked film in which the insulating films BT, HSO1, HSO2, and TP are stacked in order on the semiconductor substrate SB (see FIG. 4).

The insulating film BT is, for example, a silicon oxide film formed on the semiconductor substrate SB by, for example, the ISSG (In Situ Steam Generation) oxidation method. Thereafter, the silicon oxide film may be nitrided to form a silicon oxynitride film by performing NO treatment or plasma nitriding treatment. Alternatively, the insulating film BT may be formed by the CVD (Chemical Vapor Deposition) method. Although FIG. 11 shows the state where the insulating film MZ1 is formed on the side surfaces of the trench, on the sidewall spacers SW, and on the interlayer insulating film IL1, it is conceivable that the insulating film BT is formed only at the bottom of the trench when the insulating film BT is formed by the oxidation method. Each of the insulating films HSO1, HSO2, and TP can be formed by, for example, the CVD method or the like.

The conductive film CF is a polysilicon film or a metal film. When the conductive film CF is a polysilicon film, the conductive film CF can be formed by, for example, the CVD method. When the conductive film CF is a metal film, the conductive film CF can be formed by, for example, the sputtering method.

Figure 12:
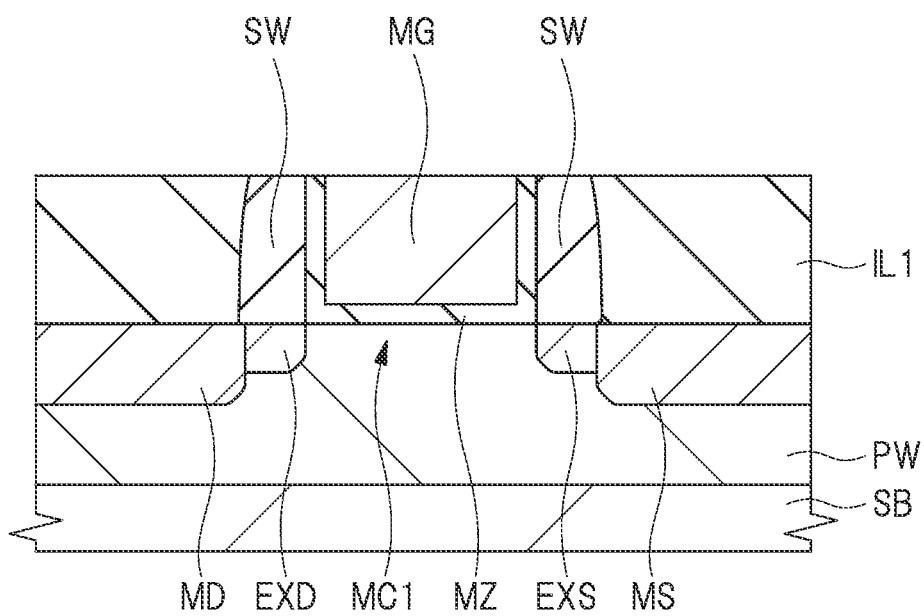
FIG. 12 is a cross-sectional view for describing the manufacturing process subsequent to FIG. 11.

Next, as shown in FIG. 12, the film on the interlayer insulating film IL1 is polished and removed by, for example, the CMP method. In this way, the upper surface of the interlayer insulating film IL1 and the upper surfaces of the sidewall spacers SW are exposed. Also, by the polishing process, the gate insulating film MZ made of the insulating film MZ1 and the memory gate electrode MG made of the conductive film CF formed on the gate insulating film MZ are formed in the trench.

As described above, the memory cell MC1 according to the present embodiment shown in FIG. 12 is formed.

After that, the interlayer insulating film IL2, the plugs PG, the interlayer insulating film IL3, and the wirings M1 are formed, so that the structure shown in FIG. 1 is obtained.

Namely, for example, a silicon oxide film is formed on the memory cell MC1 by, for example, the CVD method, thereby forming the interlayer insulating film IL2 made of the silicon oxide film. Subsequently, contact holes are formed in the stacked film composed of the interlayer insulating films IL1 and IL2 by the photolithography method, the dry etching method, and the like, and a conductive film mainly made of tungsten or the like is buried in the contact holes. In this way, the plurality of plugs PG is formed in the stacked film. The plurality of plugs PG is connected to the diffusion region MS and the diffusion region MD, respectively. The memory gate electrode MG is also connected to the plug PG, but the illustration thereof is omitted in FIG. 1.

Subsequently, the interlayer insulating film IL3 is formed on the interlayer insulating film IL2 in which the plugs PG are buried. Then, after forming wiring trenches in the interlayer insulating film IL3, the wirings M1 connected to the plugs PG are formed in the interlayer insulating film IL3 by burying a conductive film mainly made of, for example, copper in the wiring trenches. The structure of the wiring M1 is referred to as a so-called damascene wiring structure.

Thereafter, wirings in the second and subsequent layers are formed by the Dual Damascene method or the like, but the description and illustration thereof are omitted here. Further, the wiring M1 and the wiring in the layer above the wiring M1 are not limited to the damascene wiring structure, and may be formed by, for example, patterning a tungsten film or an aluminum film.

Second Embodiment

Figure 13:
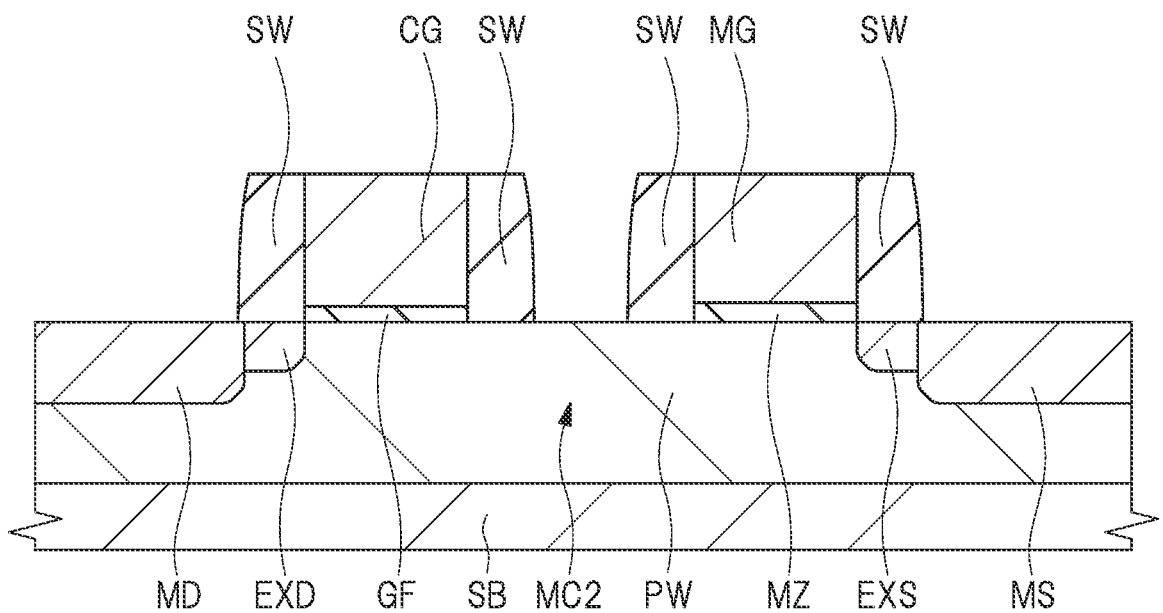
FIG. 13 is a cross-sectional view showing a semiconductor device according to the second embodiment.

In the first embodiment, the memory cell composed of one transistor has been described, but the memory cell may be composed of two transistors (control gate electrode and memory gate electrode). In the following, a configuration which is composed of a control gate electrode and a memory gate electrode and in which a charge storage layer in a gate insulating film under the memory gate electrode has a two-layer structure will be described with reference to FIG. 13. FIG. 13 is a cross-sectional view showing a memory cell MC2 which is a semiconductor device according to the present embodiment. Illustrations of the interlayer insulating film, the plug, and the wiring are omitted here unlike FIG. 1. Also, although the case where the gate insulating film MZ and the memory gate electrode MG are buried in the trench formed by removing the dummy gate electrode and the like has been described in the first embodiment, the case where the gate insulating film MZ and the memory gate electrode MG are formed before forming the interlayer insulating film will be described here.

As shown in FIG. 13, the gate insulating film MZ and the memory gate electrode MG are sequentially formed on the semiconductor substrate SB in which the well region PW, the extension regions EXS and EXD, and the diffusion regions MS and MD are formed. The sidewall spacers SW are formed on both side surfaces of the memory gate electrode MG. The structure of the memory cell MC2 of the present embodiment described above is the same as that of the first embodiment. However, in the memory cell MC2, the extension region EXD and the diffusion region MD constituting the drain region are separated from the memory gate electrode MG in a plan view. Further, a control gate electrode CG is formed via a gate insulating film GF on the semiconductor substrate SB between the memory gate electrode MG and the drain region MD. Both side surfaces of the stacked film composed of the gate insulating film GF and the control gate electrode CG are covered with the sidewall spacers SW. The control gate electrode CG and the memory gate electrode MG are insulated and separated from each other.

The gate insulating film GE is made of, for example, a silicon oxide film, and the control gate electrode CG is made of, for example, a polysilicon film. Here, the sidewall spacers SW that cover the opposing surfaces of the control gate electrode CG and the memory gate electrode MG are separated from each other.

The control gate electrode CD, the source region, and the drain region constitute a control transistor, and the memory gate electrode MG, the source region, and the drain region constitute a memory transistor. Namely, the memory cell MC2 is composed of two transistors. The control transistor is used to control the operation of the memory cell MC2. In this memory cell MC2, the cell size is larger than that in the case where the memory cell is composed of one transistor, but complicated control is not required and the memory operation is simplified.

Even in the memory cell composed of two transistors according to this embodiment, the charge storage layer CSL in the gate electrode MZ constituting the memory transistor can be composed of the two layers of the insulating films HSO1 and HSO2 as in the first embodiment (see FIG. 4). Namely, the insulating film HSO1 constituting the lower layer portion of the charge storage layer CSL is a layer whose charge storage amount (charge trapping amount) is smaller than that of the insulating film HSO2 constituting the upper layer portion of the charge storage layer CSL. As a result, the same effect as that of the first embodiment can be obtained.

First Modification

Figure 14:
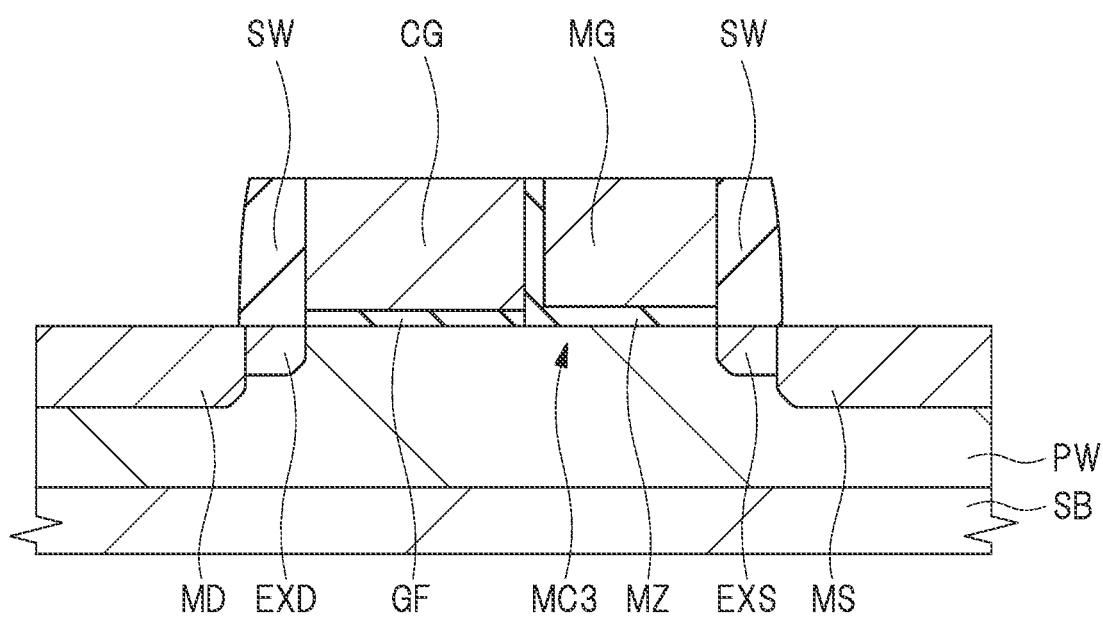
FIG. 14 is a cross-sectional view showing a semiconductor device according to the first modification of the second embodiment.

When a memory cell is composed of two transistors, the control gate electrode CG and the memory gate electrode MG may be adjacent to each other via the gate insulating film MZ including the charge storage layer as in this modification shown in FIG. 14. FIG. 14 is a cross-sectional view showing a memory cell MC3 which is a semiconductor device according to this modification.

As shown in FIG. 14, in this modification, the sidewall spacer SW is not formed between the control gate electrode CG and the memory gate electrode MG and the gate insulating film MZ is formed instead unlike the structure shown in FIG. 13. Namely, each of the opposing surfaces of the control gate electrode CG and the memory gate electrode MG is in contact with the gate insulating film MZ. The gate insulating film MZ is continuously formed between the control gate electrode CG and the memory gate electrode MG and between the memory gate electrode MG and the semiconductor substrate SB. Namely, the gate insulating film MZ has an L-shaped cross section.

The memory cell MC3 like this is referred to as a split-gate memory cell. The split-gate memory cell MC3 has a feature of the higher operation speed as compared with the memory cell MC2 shown in FIG. 13.

Even in the split-gate memory cell of this modification, the same effect as that of the first embodiment can be obtained by applying the gate insulating film MZ shown in FIG. 4.

Second Modification

Figure 15:
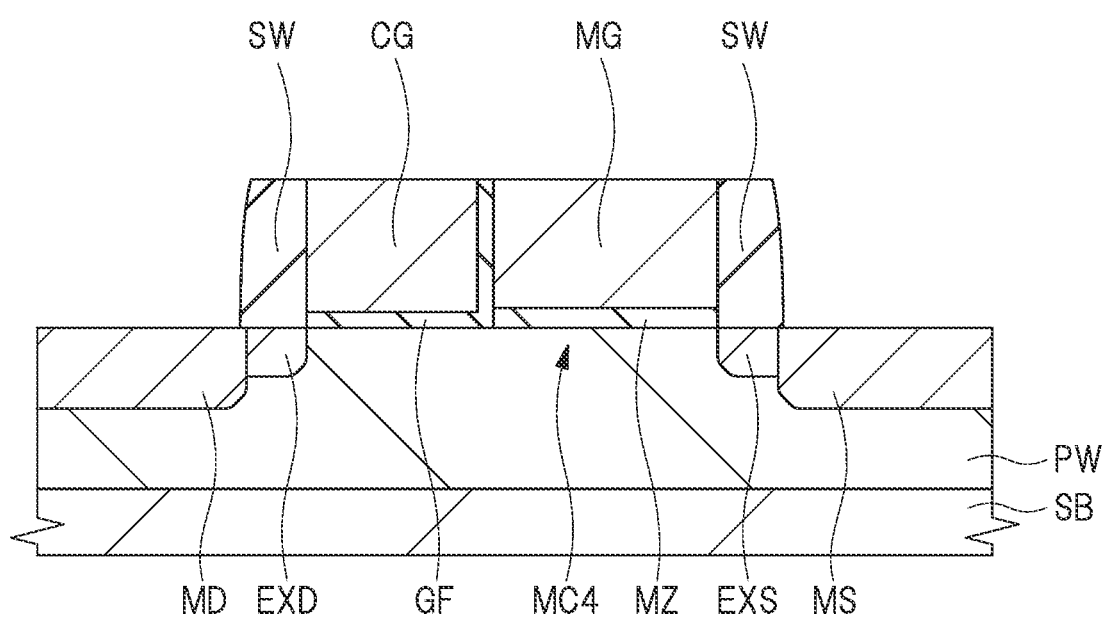
FIG. 15 is a cross-sectional view showing a semiconductor device according to the second modification of the second embodiment.

When a memory cell is composed of two transistors, the control gate electrode CG and the memory gate electrode MG may be adjacent to each other via the gate insulating film GF which does not include the charge storage layer as in this modification shown in FIG. 15. FIG. 15 is a cross-sectional view showing a memory cell MC4 which is a semiconductor device according to this modification.

As shown in FIG. 15, in this modification, the sidewall spacer SW is not formed between the control gate electrode CG and the memory gate electrode MG and the gate insulating film GF is formed instead unlike the structure shown in FIG. 13. Namely, each of the opposing surfaces of the control gate electrode CG and the memory gate electrode MG is in contact with the gate insulating film GF. The gate insulating film GF is continuously formed between the control gate electrode CG and the memory gate electrode MG and between the control gate electrode CG and the semiconductor substrate SB. Namely, the gate insulating film GF has an L-shaped cross section.

The memory cell MC4 like this is referred to as a split-gate memory cell. The split-gate memory cell MC4 has a feature of the higher operation speed as compared with the memory cell MC2 shown in FIG. 13.

The memory cell MC3 described in the first modification is obtained by forming the control gate electrode CG and then forming the gate insulating film MZ and the memory gate electrode MG in a sidewall shape. On the other hand, the memory cell MC4 of this modification is obtained by forming the gate insulating film MZ and the memory gate electrode MG and then forming the gate insulating film GF and the control gate electrode CG in a sidewall shape.

Even in the split-gate memory cell of this modification, the same effect as that of the first embodiment can be obtained by applying the gate insulating film MZ shown in FIG. 4.

In the foregoing, the invention made by the inventors has been specifically described based the embodiments, but the present invention is not limited to the embodiments described above and can be variously modified within the range not departing from the gist thereof.

For example, in the above-described embodiments, the case where the memory cell is formed on the flat semiconductor substrate SB has been described, but the memory cell may be configured to have a fin structure. Namely, the memory cell may be provided by forming a protruding portion by processing a part of the semiconductor substrate into a convex shape and then forming the gate insulating film MZ (see FIG. 1) so as to cover an upper surface and side surfaces of the protruding portion.

What is claimed is:

1. A semiconductor device comprising a non-volatile memory cell,
   the non-volatile memory cell including:
     a semiconductor substrate;
     a first insulating film formed on the semiconductor substrate;
     a charge storage layer formed on the first insulating film and capable of retaining charge;
     a second insulating film formed on the charge storage layer; and
     a first gate electrode formed on the second insulating film,
   wherein the charge storage layer includes:
     a third insulating film formed on the first insulating film and containing hafnium and silicon, the third insulating film being capable of retaining charge; and
     a fourth insulating film formed on the third insulating film and containing hafnium and silicon, the fourth insulating film being capable of retaining charge,
   wherein all materials of the third insulating film are the same as all materials of the fourth insulating film,
   wherein a hafnium concentration of the third insulating film is lower than a hafnium concentration of the fourth insulating film, and
   wherein a bandgap of the third insulating film is larger than a bandgap of the fourth insulating film.

2. The semiconductor device according to claim 1, wherein the hafnium concentration of the fourth insulating film is less than 60%.

3. The semiconductor device according to claim 1, wherein a relative dielectric constant of the third insulating film is lower than a relative dielectric constant of the fourth insulating film.

4. The semiconductor device according to claim 1, wherein a film thickness of the third insulating film is 1.5 to 3 nm.

5. The semiconductor device according to claim 1,
   wherein the non-volatile memory cell further includes:
     a fifth insulating film formed on the semiconductor substrate; and
     a second gate electrode formed on the fifth insulating film, and
   wherein the first gate electrode is insulated and separated from the second gate electrode.

6. The semiconductor device according to claim 5, wherein the charge storage layer is continuously formed between the first gate electrode and the second gate electrode and between the first gate electrode and the semiconductor substrate.

7. The semiconductor device according to claim 6, wherein the fourth insulating film is continuously formed between the first gate electrode and the second gate electrode and between the second gate electrode and the semiconductor substrate.

8. The semiconductor device according to claim 1, wherein a film thickness of the fourth insulating film is larger than a film thickness of the third insulating film.

* * * * *